(12) United States Patent
Miura

(10) Patent No.: US 6,596,567 B1
(45) Date of Patent: Jul. 22, 2003

(54) METHOD FOR FABRICATING A SEMICONDUCTOR DEVICE HAVING A IMPURITY LAYER DISPOSED BETWEEN A NON-DOPED SILICON FILM AND HIGH MELTING-POINT METAL FILM FOR REDUCING SOLID STATE REACTION BETWEEN SAID HIGH MELTING-POINT METAL FILM AND POLYCRYSTAL SILICON FILM

(75) Inventor: Hirotomo Miura, Tokyo (JP)

(73) Assignee: United Microelectronics Corporation, Taiwan (CH)

( * ) Notice: Subject to any disclaimer, the term of this patent is extended or adjusted under 35 U.S.C. 154(b) by 44 days.

(21) Appl. No.: 09/710,883

(22) Filed: Nov. 14, 2000

Related U.S. Application Data

(62) Division of application No. 09/116,955, filed on Jul. 17, 1998, now Pat. No. 6,208,003.

(30) Foreign Application Priority Data

Sep. 26, 1997 (JP) .............................. 9-279860

(51) Int. Cl.⁷ ...................... H01L 21/335; H01L 21/336
(52) U.S. Cl. ...................... 438/142; 438/197; 438/289
(58) Field of Search ............................. 438/142, 197, 438/201, 211, 174, 181, 194, 289

(56) References Cited

U.S. PATENT DOCUMENTS

| | | | |
|---|---|---|---|
| 4,590,665 A | * 5/1986 | Owens et al. | 29/571 |
| 4,788,160 A | * 11/1988 | Havemann et al. | 437/200 |
| 5,710,454 A | 1/1998 | Wu | 257/413 |
| 6,015,997 A | 1/2000 | Hu et al. | 257/412 |

FOREIGN PATENT DOCUMENTS

| | | |
|---|---|---|
| JP | 62-55928 | 3/1987 |
| JP | 4-303942 | 10/1992 |
| JP | 6-326304 | 11/1994 |
| JP | 7-263686 | 10/1995 |
| JP | 8-31928 | 2/1996 |

OTHER PUBLICATIONS

Wolf, Stanley Ph.D., Silicon Processing for the VLSI Era, vol. 3 2: Process Integration; 1990, pp. 321–322.*

* cited by examiner

Primary Examiner—Kamand Cuneo
Assistant Examiner—Scott B. Geyer
(74) Attorney, Agent, or Firm—Connolly Bove Lodge & Hutz LLP

(57) ABSTRACT

A semiconductor device has a semiconductor substrate and a conductive layer formed above the semiconductor substrate. The conductive layer has a silicon film, a silicide film formed on the silicon film, and a high melting-point metal film formed on the silicide film. The silicon film has a non-doped layer, which does not contain impurities, and an impurity layer which is formed on the non-doped layer and contains impurities. The silicide film is formed on the impurity layer of the silicon film.

11 Claims, 4 Drawing Sheets

METHOD FOR FABRICATING A SEMICONDUCTOR DEVICE HAVING A IMPURITY LAYER DISPOSED BETWEEN A NON-DOPED SILICON FILM AND HIGH MELTING-POINT METAL FILM FOR REDUCING SOLID STATE REACTION BETWEEN SAID HIGH MELTING-POINT METAL FILM AND POLYCRYSTAL SILICON FILM

This application is a divisional application Ser. No. 09/116,955 filed Jul. 17, 1998, now U.S. Pat. No. 6,208,003.

BACKGROUND OF THE INVENTION

1. Field of the Invention

The present invention relates to a semiconductor device and a method for fabricating the same, and more particularly to a semiconductor device that is provided with a polycide interconnection layer having a silicide film formed on a polycrystal silicon film, and a method for fabricating the semiconductor device.

2. Description of the Related Art

Conventionally, polycrystal silicon that is an electrically conductive material durable against high heat treatments has been widely used as a material of various kinds of wiring layers. A gate electrode of a MOS transistor represents one of the wiring layers. However, even if impurities are introduced or admitted to the polycrystal silicon film by as much an amount as possible in order to increase the conductivity of the polycrystal silicon film, there arises a problem that the resulting resistivity is very higher than that of a film of metal such as aluminum. To solve this problem, a polycide interconnection layer that is chemically stable and has low resistivity is widely used for the wiring layer. The polycide interconnection layer is formed by the following way. A high melting-point metal film is formed on the polycrystal silicon film. Then, the two films are caused to undergo a solid state reaction through a heat treatment, so that a silicide film is formed. The high melting-point metal film includes a metal selected from tungsten, titanium, tantalum, ruthenium, zirconium, molybdenum and cobalt, for example.

However, when the polycide interconnection layer, especially, a polycide gate electrode is formed, the following problems are faced. The heat treatment is applied after ion-implanting the impurities into the polycrystal silicon film formed on a gate insulating film and forming the high melting-point metal film. As the solid state reaction of the polycrystal silicon film with the high melting-point metal film proceeds at a low rate, the heat treatment must be conducted for a long time. Accordingly, if the solid state reaction rate is irregular or uneven, the reaction rate in the direction toward the gate insulating film becomes non-uniform. As a result, the tip portions of the silicide film reach the gate insulating film, so that it leads to problems such as the generation of leakage current and the decrease in breakdown voltage.

As one solution to this problem, the following method is disclosed in JP-A-62-55928. A second polycrystal silicon film not doped with impurities (non-doped polycrystal silicon film) is formed on a first polycrystal silicon film doped with impurities (phosphorus). A high melting-point metal film (titanium film) is formed on the second polycrystal silicon film, and then the reaction for forming silicide is carried out. According to this method, the first polycrystal silicon film plays the role of a stopper when the solid state reaction proceeds, so that the solid state reaction can be prevented from reaching the gate insulating film. In this method, however, the polycrystal silicon film of a two-layer structure having the doped first polycrystal silicon film and the non-doped second polycrystal silicon film must be formed. As a result, the number of fabrication steps is necessarily increased and the structure is necessarily complicated, so that it is possibly an obstacle to the formation of a semiconductor device with high density and high integration demanded in recent years.

The following JP-A-6-326304 and JP-A-7-263686 disclose methods for forming the polycide interconnection layer.

(1) JP-A-6-326304

This publication discloses the following method in order to prevent a gate electrode from suffering damage by suppressing stress exerting on a gate oxide film when the gate electrode of polycide structure is formed. A phosphorus doped amorphous silicon film is formed. The phosphorus doped amorphous silicon film is converted into a phosphorus doped polysilicon film by a heat treatment which is applied at a temperature which is lower than a maximum temperature in a heat treatment process for forming source and drain regions. A tungsten silicide film is formed on the phosphorus doped polysilicon film, and then the two films are patterned to form the gate electrode.

(2) JP-A-7-263686

This publication discloses the following method in order to prevent abnormal oxidization of a polycide interconnection layer surface and peel-off of a high melting-point silicide film and in order to prevent the high melting-point metal silicide film and polysilicon film from being left behind in patterning for forming a gate electrode wiring. A polysilicon film and a tungsten silicide film are sequentially formed on a gate oxide film. The polysilicon film and the tungsten silicide film are patterned to form a gate electrode wiring. A thin oxide film is formed on the tungsten silicide film.

SUMMARY OF THE INVENTION

An object of the present invention is to provide a semiconductor device in which the increase in the number of fabrication steps and the complication of the structure can be prevented, the control of the heat treatment for forming silicide can be facilitated, and the resistivity of conductive layers can be decreased during mass production to increase the operation speed of the semiconductor device, and to provide a method for fabricating the semiconductor device.

A first semiconductor device according to the present invention comprises: a semiconductor substrate; and a conductive layer formed above the semiconductor substrate, wherein the conductive layer includes: a silicon film including a non-doped layer, which does not contain impurities, and an impurity layer which is formed on the non-doped layer and contains impurities; a silicide film formed on the impurity layer of the silicon film; and a high melting point metal film formed on the silicide film.

A second semiconductor device according to the present invention comprises: a semiconductor substrate; an insulating layer formed on the semiconductor substrate; and a conductive layer formed on the insulating layer, wherein the conductive layer includes: a silicon film including a non-doped layer, which does not contain impurities, and an impurity layer which is formed on the non-doped layer and contains impurities; a silicide film formed on the impurity layer of the silicon film; and a high melting-point metal film formed on the silicide film.

A method for fabricating a semiconductor device according to the present invention is a method for fabricating a semiconductor device having a semiconductor substrate and a conductive layer formed above the semiconductor substrate, and comprises a step of forming the conductive layer. In the method, the step of forming the conductive layer comprises: a first step of forming a non-doped silicon film above the semiconductor substrate; a second step of introducing impurities the non-doped silicon film so as to form an impurity layer, which contains the impurities, at only an inner intermediate portion of the non-doped silicon film; a third step of forming a high melting-point metal film on the non-doped silicon film having the impurity layer at only the inner intermediate portion; and a fourth step of reacting the non-doped silicon film having the impurity layer at only the inner intermediate portion with the high melting-point metal film through a heat treatment to form a silicide film at an interface and near the interface between the high melting-point metal and the non-doped silicon film having the impurity layer at only the inner intermediate portion.

In the present invention, the silicon film (for example, a polycrystal silicon film or an amorphous silicon film) is formed on an insulating film (for example, a gate insulating film or an interlayer insulating film). The impurities are introduced to the silicon film in such a manner that the impurities do not reach the insulating film. Subsequently, the high melting-point metal film is formed on the silicon film, and then the two films are caused to undergo the solid state reaction to form a silicide film near the interface between the two films. At that time, the lower the concentration of the impurities introduced to the silicon film, the higher the rate of the solid state reaction of the silicon film with the high melting-point metal film becomes. In other words, a non-doped silicon film and a silicon film having a high impurity concentration level are taken, the solid state reaction rate is drastically higher for the former than for the latter. Accordingly, when the impurity concentration profile of the impurity layer is made to be very steep at the interface between the impurity layer and the high melting-point metal film by introducing the impurities to only an inner intermediate portion of the silicon film to form the impurity layer only at the inner intermediate portion of the silicon film, the impurity layer can be used as a stopper against the solid state reaction. As a result, even when the rate of the solid state reaction of the silicon film with the high melting-point metal film becomes irregular, the solid state reaction rate is abruptly decreased at the impurity layer, thus preventing the solid state reaction from being so affected by the irregularity as to reach the insulating film. Through this, a conductive layer (for example, a polycide layer) substantially meeting an intended design can be formed.

DESCRIPTION OF THE PREFERRED EMBODIMENTS

Figure 2A:
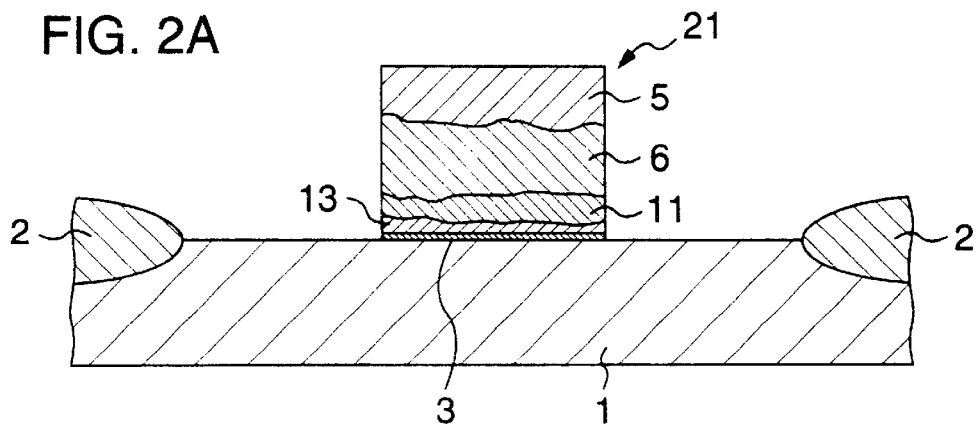
FIGS. 2A to 2C are sectional views also showing, in order of fabrication steps, the method for fabricating the MOS transistor according to the first embodiment of the present invention.
Figure 2B:
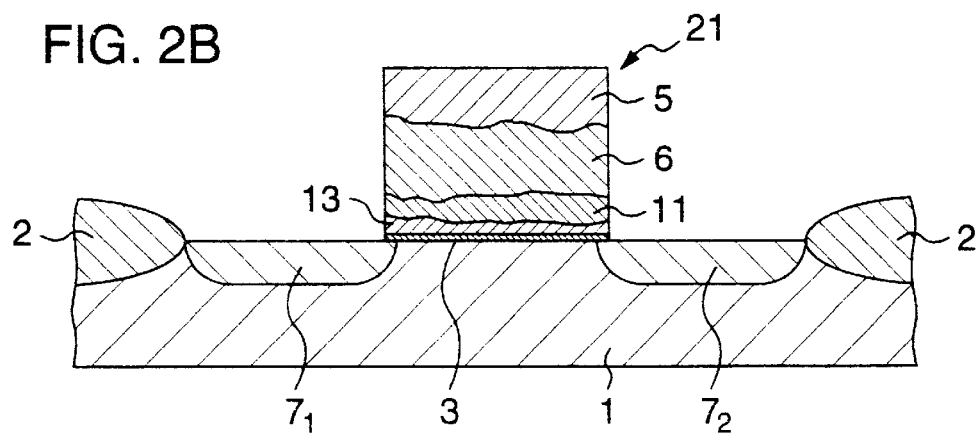
Figure 2C:
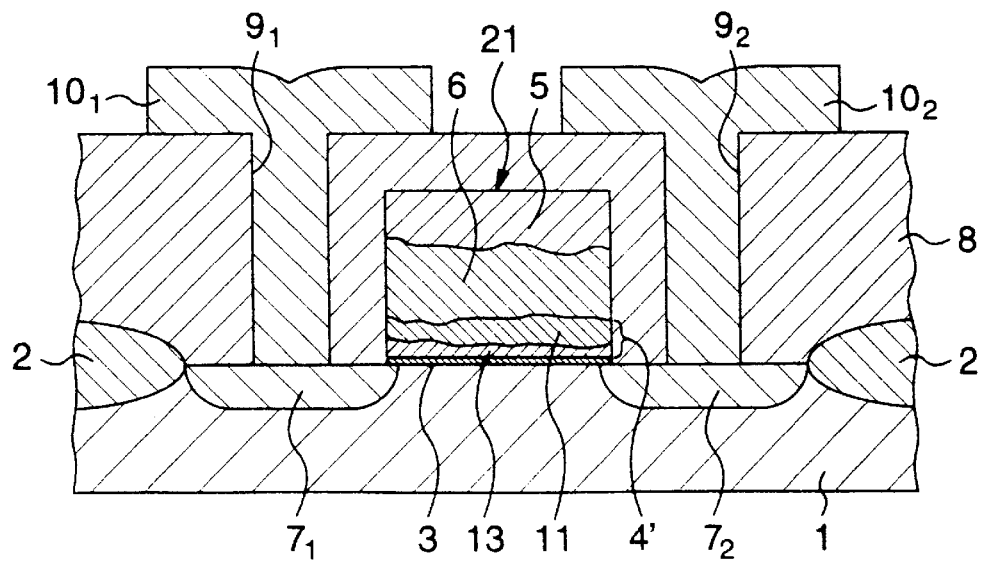

Referring to FIG. 2C, in a MOS transistor that represents a semiconductor device according to a first embodiment of the present invention, an oxide film 2 for device separation is formed at a device separation area on a semiconductor substrate 1 through so-called LOCOS process. A gate oxide film 3 is formed on the semiconductor substrate 1. A polycide gate electrode 21 is formed on the gate oxide film 3. First and second impurity diffused layers $7_1$ and $7_2$ are formed in the semiconductor substrate 1 on both sides of the polycide gate electrode 21. An interlayer insulating film 8 is formed on the polycide gate electrode 21, first and second impurity diffused layers $7_1$ and $7_2$ and device separation oxide film 2. The interlayer insulating film 8 has first and second contact holes $9_1$ and $9_2$ which expose parts of the first and second impurity diffused layers $7_1$ and $7_2$, respectively. First and second wiring layers $10_1$ and $10_2$ are formed on the interlayer insulating film 8 so as to fill up the first and second contact holes $9_1$ and $9_2$, respectively. Here, the polycide gate electrode 21 includes a polycrystal silicon film 4' that has a non-doped layer 13 not containing impurities and an impurity layer 11 containing impurities. The polycide gate electrode 21 further include a silicide film 6 formed on the impurity layer 11 of the polycrystal silicon film 4', and a tungsten film 5 formed on the silicide film 6.

A method for fabricating the aforementioned MOS transistor will now be described with reference to FIGS. 1A to 1C and FIGS. 2A to 2C.

Figure 1A:
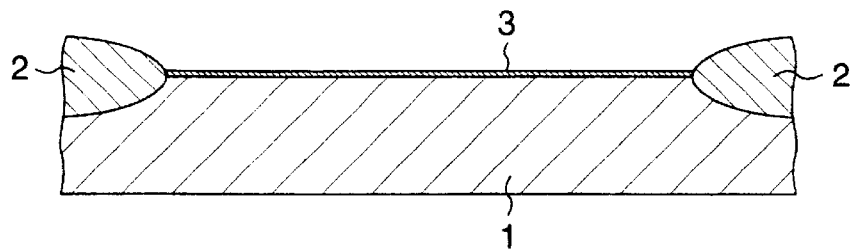
FIGS. 1A to 1C are sectional views showing, in order of fabrication steps, a method for fabricating a MOS transistor according to a first embodiment of the present invention.

The oxide film 2 for device separation having a thickness of about 3000 Å to 4000 Å is, as shown in FIG. 1A, formed at a device separation area on the silicon semiconductor substrate 1 through the so-called LOCOS process. The gate oxide film 3 having a thickness of about 50 Å to 200 Å is formed at a device formation area on the semiconductor substrate 1 through the thermal oxidization process. In the present embodiment, the thickness of the gate oxide film 3 is about 170 Å. A non-doped polycrystal silicon film 4 having a thickness of about 1500 Å is deposited on both the gate oxide film 3 and the device separation oxide film 2 through the known chemical vapor deposition process (CVD process).

Figure 1B:
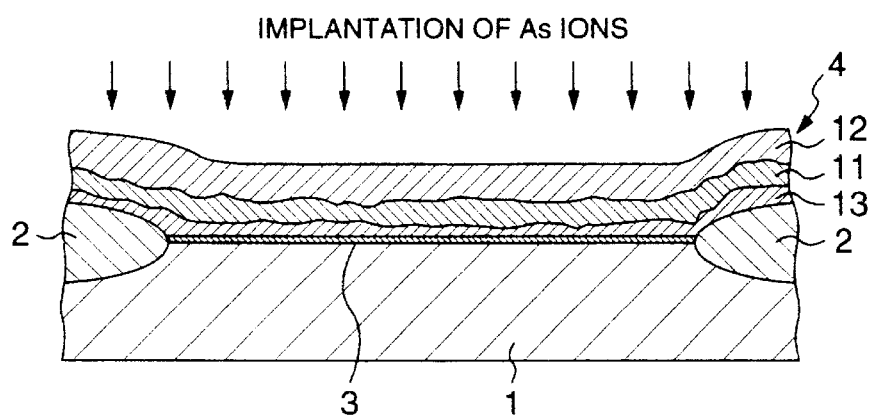

Thereafter, arsenic (As) ions serving as impurities are, as shown in FIG. 1B, ion-implanted into the non-doped polycrystal silicon film 4. At that time, it is relatively easy to control the doping depth of the arsenic ions so that they do not reach the gate oxide film 3. For example, the ion implantation is carried out at an accelerating energy level of about 80 keV and at a dosage of about $1.0 \times 10^{15}/cm^2$. Accordingly, by this ion implantation, the non-doped polycrystal silicon film 4 is formed into a polycrystal silicon film that includes the first non-doped layer 13 on the side of the gate oxide film 3, the impurity layer 11 containing the arsenic ions, and a second non-doped layer 12 on the opposite side of the gate oxide film 3.

Figure 1C:
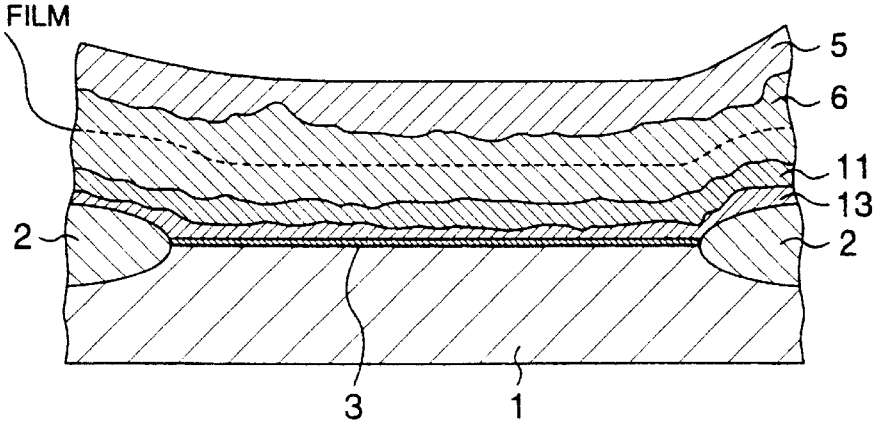

Thereafter, the tungsten film 5 serving as a high melting-point metal film is formed on the polycrystal silicon film 4 through the sputtering process. The polycrystal silicon film 4 and the tungsten film 5 are heat-treated at about 800° C. for about 10 minutes in inert atmosphere of, for example, nitrogen. During this heat treatment, the second non-doped layer 12 of polycrystal silicon film 4 undergoes the solid state reaction with the tungsten film 5 to form the silicide film 6 on the impurity layer 11 of polycrystal silicon film 4 as shown in FIG. 1C. At that time, the surface portion of the tungsten film is not formed into the silicide film 6 but remains to be the tungsten film 5.

Thereafter, the gate oxide film 3, first non-doped layer 13, impurity layer 11, silicide film 6 and tungsten film 5 are patterned to form the polycide gate electrode 21 as shown in FIG. 2A. N-type impurities (phosphorus ions or arsenic ions) are ion-implanted into the semiconductor substrate 1 by using the polycide gate 21 as a mask. As a result, the first and second impurity diffused layers $7_1$ and $7_2$ representing source and drain are formed in the semiconductor substrate 1 on both sides of the polycide gate electrode 21 as shown in FIG. 2B.

Thereafter, the interlayer insulating film 8 is, as shown in FIG. 2C, formed on the semiconductor substrate 1 through the CVD process so as to cover the polycide gate electrode 21 and device separation oxide film 2. The first and second contact holes $9_1$ and $9_2$ are formed in the interlayer insulating film 8 so as to expose parts of the first and second impurity diffused layers $7_1$ and $7_2$, respectively. An aluminum alloy film is formed on the interlayer insulating film 8 through the sputtering process so as to fill the first and second contact holes $9_1$ and $9_2$. The aluminum alloy film is then patterned to form the first and second wiring layers $10_1$ and $10_2$ which are connected to the first and second impurity diffused layers $7_1$ and $7_2$ via the first and second contact holes $9_1$ and $9_2$, respectively.

Thereafter, steps of forming another interlayer insulating film and various kinds of wiring layers ensue to finally form the MOS transistor.

In the MOS transistor fabricating method described as above, arsenic ions are implanted to the non-doped polycrystal silicon layer 4 in such a manner that the impurity layer 11 is formed only at the inner intermediate portion of the non-doped polycrystal silicon film 4. Thereby, it ensures that the polycrystal silicon film 4' comprised of the first non-doped layer 13 and the impurity layer 11 can be rendered to be sufficiently conductive. Further, the solid state reaction can be steadily prevented from reaching the gate insulating film 3 to permit the desired polycide gate electrode 21 substantially meeting the intended design to be formed. Accordingly, the increase in the number of fabrication steps and the complication of the structure can be prevented. The control of the heat treatment during formation of silicide can be facilitated. Further, the operation speed of the semiconductor device can be increased owing to the decrease in resistivity of the conductive layer achieved during mass production.

Figure 3:
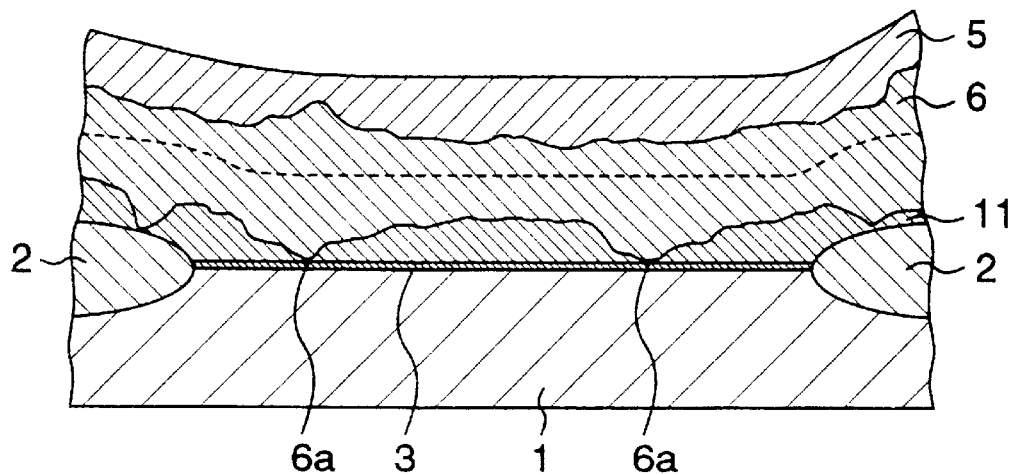
FIG. 3 is a sectional view for explaining a comparative example for the method for fabricating the MOS transistor according to the first embodiment of the present invention.

Next, problems encountered in the implantation of arsenic ions into the overall interior of the non-doped polycrystal silicon film 4 during the arsenic ion implantation step shown in FIG. 1B will be described with reference to FIG. 3.

Since the polycrystal silicon film 4 implanted with arsenic ions undergoes the solid state reaction with the tungsten film 5 at a low rate, the heat treatment for activating the solid state reaction of the polycrystal silicon film 4 with the tungsten film 5 takes a long time to proceed. Therefore, if the solid state reaction rate is irregular, the solid state reaction rate in the direction toward the gate insulating film 3 cannot be uniform, so that the tip portions 6a of the silicide film 6 sometimes reach the gate insulating film 3 (see FIG. 3). In this case, there arises such a disadvantage that the leak current is generated and the gate breakdown voltage is decreased.

The MOS transistor fabricating method according to the present embodiment makes use of the fact that the lower the concentration of arsenic ions introduced to the polycrystal silicon film, the higher the rate of the solid state reaction of the polycrystal silicon film with the tungsten film becomes. That is, arsenic ions are introduced to only the inner intermediate portion of the non-doped polycrystal initial silicon film 4 to form the impurity layer 11 at only the inner intermediate portion of the polycrystal initial silicon film 4. As a result, the impurity concentration profile at the interface between the impurity layer 11 and the tungsten film 5 may become very steep. This enables the impurity layer 11 to be used as a stopper against the solid state reaction. Hence, even if the rate of the solid state reaction of the polycrystal silicon film 4 with the tungsten film 5 becomes irregular, the solid state reaction rate decelerates abruptly in the impurity layer 11. Consequently, the solid state reaction can be prevented from being so affected by the irregular rate as to reach the gate insulating film 3.

Modifications of the present embodiment are as follows.
(1) In place of the device separation structure based on the LOCOS process using the device separation oxide film 2 shown in FIG. 1A, either a field shield device separation structure (for example, JP-A-8-31928) or a trench type device separation structure (for example, JP-A-4-303942) is used. In the former structure, a shield plate electrode is embedded in an insulating layer. In the latter structure, a groove is formed in a semiconductor substrate at a device separation area, and thereafter an insulating material is embedded in the groove.
(2) As impurities to be implanted to the non-doped polycrystal silicon film 4, phosphorus ions are used in place of the arsenic ions. In this case, in order to prevent phosphorus ions from reaching the gate oxide film 3, the ion implantation is carried out at an accelerating energy level of about 80 keV and at a dosage of about $1.0 \times 10^{15}/cm^2$.
(3) In place of the tungsten film 5 used as the high melting-point metal film, a titanium film, a tantalum film, a ruthenium film, a zirconium film, a molybdenum film or a cobalt film is used.
(4) In place of the non-doped polycrystal silicon film 4, a non-doped amorphous silicon film is used.

Figure 4:
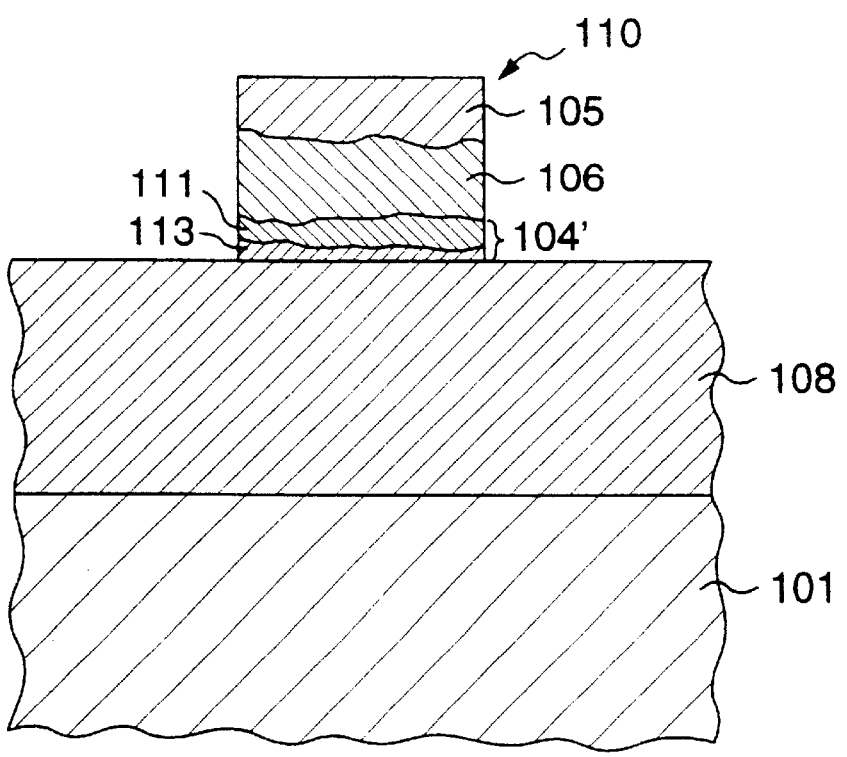
FIG. 4 is a sectional view for explaining a semiconductor device according to a second embodiment of the present invention.

Referring now to FIG. 4, a semiconductor device according to a second embodiment of the present invention will be described.

The semiconductor device according to the present embodiment comprises a silicon semiconductor substrate 101, an interlayer insulating film 108 formed on the semiconductor substrate 101, and an interconnection layer 110 formed on the interlayer insulating film 108. Here, the interconnection layer 110 includes a polycrystal silicon film 104' that is comprised of a non-doped layer 113 not containing impurities and an impurity layer 111 containing impurities. The interconnection layer 110 further includes a silicide film 106 formed on the impurity layer 111 of the polycrystal silicon film 104', and a tungsten film 105 formed on the silicide film 106. A method for forming the interconnection layer 110 is similar to that of the previously-described polycide gate electrode 21 and will not be described.

Figure 5:
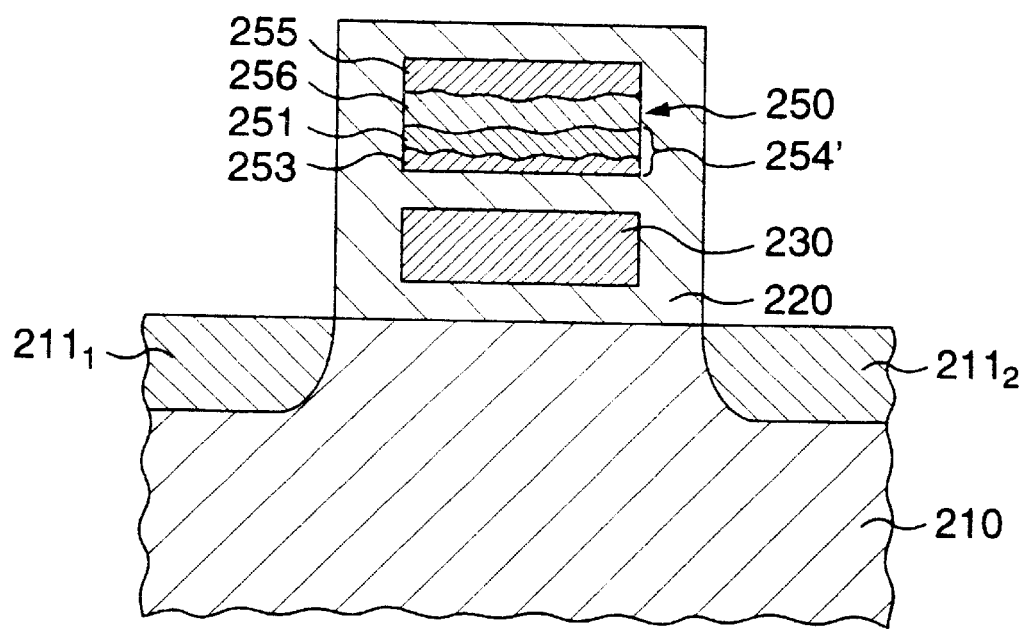
FIG. 5 is a sectional view for explaining a semiconductor device according to a third embodiment of the present invention.

Referring to FIG. 5, a semiconductor device according to a third embodiment of the present invention will be described.

The semiconductor device according to the present embodiment is a non-volatile semiconductor memory that comprises a silicon semiconductor substrate 210, a floating gate electrode 230 formed above the semiconductor substrate 210 through an insulating film 220, and a control gate electrode 250 formed above the floating gate electrode 230 through the insulating film 220. Here, the control gate electrode 250 includes a polycrystal silicon film 254' that is comprised of a non-doped layer 253 not containing impurities and an impurity layer 251 containing impurities. The control gate electrode 250 further includes a silicide film 256 formed on the impurity layer 251 of the polycrystal silicon film 254', and a tungsten film 255 formed on the silicide film 256. First and second impurity diffused layers $211_1$ and $211_2$, which serve as source and drain, are formed in the semiconductor substrate 210 on both sides of the floating gate electrode 230.

A method for forming the control gate electrode 250 in the non-volatile semiconductor memory according to the present embodiment is similar to that of the previously-described polycide gate electrode 21 and will not be described.

The present invention is in no way limited to the foregoing embodiments and can be applied to a lower electrode (storage node electrode) and an upper electrode (cell plate electrode) which are constituent elements of a memory capacitor in a DRAM.

What is claimed is:

1. A method for fabricating a semiconductor device which includes a semiconductor substrate and a conductive layer formed above said semiconductor substrate, comprising a step of forming said conductive layer, wherein said step of forming said conductive layer includes:
   a first step of forming a non-doped silicon film above said semiconductor substrate;
   a second step of introducing impurities to said non-doped silicon film so as to form an impurity layer, which contains said impurities, at only an inner intermediate portion of said non-doped silicon film;
   a third step of forming a high melting-point metal film on said non-doped silicon film having said impurity layer at only said inner intermediate portion; and
   a fourth step of reacting said non-doped silicon film having said impurity layer at only said inner intermediate portion with said high melting-point metal film through a heat treatment to form a silicide film at an interface and near the interface between said high melting-point metal film and said non-doped silicon film having said impurity layer at only said inner intermediate portion wherein said impurity layer decelerates the solid state reactions of the polycrystal silicon film with said high melting-point metal film.

2. A semiconductor device fabricating method according to claim 1, further comprising:
   a step of forming a gate insulating film on said semiconductor substrate before the step of forming said conductive layer; and
   a step of patterning said gate insulating film, said non-doped silicon film having said impurity layer at only said inner intermediate portion, said suicide film and said high melting point metal film after the step of forming on said gate insulating film said conductive layer to form a gate electrode which is comprised of said conductive layer.

3. A semiconductor device fabricating method according to claim 2, further comprising:

after the step of forming said gate electrode;
   a step of forming first and second impurity diffused layers in said semiconductor substrate on both sides of said gate electrode, respectively;
   a step of forming an interlayer insulating film on said gate electrode and said first and second impurity diffused layers;
   a step of forming, in said interlayer insulating film, first and second contact holes with expose parts of said first and second impurity diffused layers, respectively; and
   a step of embedding first and second wiring layers in said first and second contact holes, respectively.

4. A semiconductor device fabricating method according to claim 1, wherein in said second step, said impurities are introduced to said non-doped silicon film through ion implantation process.

5. A semiconductor device fabricating method according to claim 4, wherein said impurities are phosphorus ions or arsenic ions.

6. A semiconductor device fabricating method according to claim 1, wherein said impurities are phosphorus ions or arsenic ions.

7. A semiconductor device fabricating method according to claim 1, wherein said silicon layer is a polycrystal silicon layer.

8. A semiconductor device fabricating method according to claim 1, wherein said silicon layer is an amorphous silicon layer.

9. A semiconductor device fabricating method according to claim 1, further comprising:
   a step of forming an interlayer insulating film on said semiconductor substrate before the step of forming said conductive layer; and
   a step of patterning said non-doped silicon film having said impurity layer at only said inner intermediate portion, said silicide film, and said high melting point film after the step of forming said conductive film to form on said interlayer insulating film an interconnection layer which is comprised of said conductive layer.

10. A semiconductor device fabricating method according to claim 1, further comprising:
   a step of forming a gate insulating film on said semiconductor substrate and forming a floating electrode on said gate insulating film, before the step of forming said conductive layer; and
   a step of patterning said gate insulating film, said non-doped silicon film having said impurity layer at only said inner intermediate portion, said silicide film, and said high melting-point metal film after the step of forming said conductive film to form above said floating gate electrode a control gate electrode which is comprised of said conductive layer.

11. A semiconductor device fabricating method according to claim 1, wherein in said second step, said impurity layer which contains said impurities is formed so as to leave said non-doped silicon film, which does not contain said impurities, at least on a surface of said silicon film on the side of semiconductor substrate.

* * * * *